US006472835B2

(12) United States Patent
Ogasawara

(10) Patent No.: US 6,472,835 B2
(45) Date of Patent: *Oct. 29, 2002

(54) OPENING AND CLOSING MOTION CONTROL DEVICE FOR CLOSING MEMBER

(75) Inventor: Kazuyoshi Ogasawara, Shizuoka-ken (JP)

(73) Assignee: Yazaki Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,284

(22) Filed: Dec. 15, 1999

(65) Prior Publication Data

US 2002/0043948 A1 Apr. 18, 2002

(30) Foreign Application Priority Data

Dec. 18, 1998 (JP) .......................................... 10-361225

(51) Int. Cl.[7] ............................ B60J 1/00; G01R 29/12

(52) U.S. Cl. .................... 318/266; 318/468; 200/61.43; 324/457

(58) Field of Search ................................ 318/466, 467, 318/468, 469, 286, 264, 265, 266; 324/457, 691; 307/116; 200/61.42, 61.43, 61.44

(56) References Cited

U.S. PATENT DOCUMENTS 4,453,112 A * 6/1984 Sauer et al. ................ 318/281
4,943,757 A * 7/1990 Richter et al. .............. 318/468
4,983,896 A * 1/1991 Sugiyama et al. .......... 318/286
5,166,586 A * 11/1992 Yaguchi ..................... 318/434
5,621,290 A * 4/1997 Heller et al. ................ 318/466
5,966,071 A * 10/1999 Tsuge et al. ................ 340/438
5,998,951 A * 12/1999 Dove ......................... 318/282

FOREIGN PATENT DOCUMENTS

JP 62-68118 3/1987

* cited by examiner

*Primary Examiner*—Bentsu Ro
(74) *Attorney, Agent, or Firm*—Finnegan, Henderson, Farabow, Garrett, & Dunner, L.L.P.

(57) ABSTRACT

A simple and cheap opening and closing motion control device is provided for avoiding pinching of an object by a window glass with high accuracy. The device includes a flexible weather strip arranged along a contact portion of a window frame, the contact portion being touched by the window glass when it is closed, a linear electrostatic-capacity detecting sensor embedded in the weather strip, for detecting an electrostatic capacity in the circumference of the sensor, a control micro-computer for judging whether or not the object is pinched by the closing motion of the window glass, on the basis of the detection of the sensor, and a motor drive circuit for allowing a motor to either stop or open the window glass when the micro-computer judges that the object is on the point of being pinched.

7 Claims, 6 Drawing Sheets

OPENING AND CLOSING MOTION CONTROL DEVICE FOR CLOSING MEMBER

BACKGROUND OF THE INVENTION

1. Field of the Invention

The present invention relates to an opening and closing motion control device which is constructed so as to perform an opening and closing motion of a closing member, such as a door window of a vehicle, by using a driving unit, for exempt, a motor for driving the door window. Particularly, it relates to an opening and closing motion control device which is capable of avoiding the closing member's pinching an object, which may be caused with respect to the closing motion of the member, with a simple and cheap arrangement and high accuracy, irrespective of conditions of the object.

2. Description of the Related Art

Hitherto, there is generally known an opening and closing motion control device which is constructed so as to perform the opening and closing motion of the closing member, for example, the door window for the vehicle, a roof window thereof, etc. by using the motor or the like.

As one example of the opening and closing motion control devices of this kind, Japanese Unexamined Patent Publication No. 62-68,118 discloses a power window driving device apparatus which can avoid the closing member's pinching of the object, which pinching may be caused in the closing motion of the closing member.

The power window driving device includes a sensing part of an electrostatic-capacity type of proximity switch positioned on an upper end of a window frame and a limit switch arranged in a position before the proximity switch's detection of the door window and also activated by the rising of the door window. In the rising operation of the door window, when the limit switch is inactivated, the power window driving device is constructed so as to stop the operation or lower the door window by a detection output of the proximity switch. While, in the rising operation of the door window, when the limit switch is activated, the power window driving device is constructed so as to stop the, function of the proximity switch.

According to the art disclosed in the above publication, when there is an object (e.g. a hand, fingers, etc.) in the vicinity of the window frame where the sensing part of the proximity switch is positioned, then the sensing part of the proximity switch detects the presence of the object thereby to stop or lower the door window automatically. In this way, the object can be prevented from being pinched by the door window.

However, the above-mentioned power window driving device have problems to be solved, as follows. That is, since the pinching of the object is detected by using the electrostatic-capacity type of proximity switch, there is a need to provide the above-mentioned limit switch specially, causing the manufacturing cost to be increased by the complicated circuits in the device. In addition, there is a possibility that the detection of pinching cannot be maintained with high accuracy.

We now describe the reason why it is necessary to provide the limit switch specially. First, it should be noted that the electrostatic-capacity type of proximity switch usually detects an airborne capacity corresponding to the surrounding atmosphere, such as the ground, the window frame, etc. even when no object exists in the surroundings. Therefore, providing that no limit switch is provided in the device, in even a case of closing the door window without pinching the object, the electrostatic-capacity type of proximity switch will regard the approaching door window as the object by mistake, so that the door window will be stopped or lowered. This is the reason why it is necessary to provide the limit switch specially.

On the other hand, the possibility that the detection of pinching cannot be maintained with high accuracy comes from the following situation. Note again, the electrostatic-capacity type of proximity switch detects whether the object is approaching, by detecting a change in electrostatic-capacity. Therefore, if the dressed passenger's hand or fingers are pinched between the window frame and the door window door, there is a case that the proximity switch cannot detect the pinching.

Under such a situation, the persons in this art have looked forward to the development of new technique by which it is possible to avoid pinching of the object irrespective of conditions thereof, with the simple and cheap constitution and high accuracy.

SUMMARY OF THE INVENTION

It is therefore an object of the present invention to provide a simple and cheap opening and closing motion control device which is capable of avoiding the pinching of the object, which pinching may be caused with the closing motion of a closing member, irrespective of conditions of the object, with high accuracy.

The above-mentioned object can be solved by providing an opening and closing motion control device which is constructed so as to perform an opening and closing motion of a closing member by using a driving unit for driving the closing member, the opening and closing motion control device comprising:

- a flexible seal member arranged along a contact portion of a ground potential member, the contact portion being touched by the closing member when the closing member is closed up perfectly;
- a linear electrostatic-capacity detecting unit embedded in the seal member, for always detecting an electrostatic capacity in the circumference of the electrostatic capacity detecting unit and also outputting the so-obtained electrostatic capacity;
- a pinching judging unit electrically connected to the electrostatic-capacity detecting unit, for judging whether or not an object is pinched by the closing motion of the closing member, on the basis of the detection of pinching by the electrostatic capacity detecting unit; and
- a drive control unit electrically connected to the pinching judging unit, allowing the driving unit to either stop the closing member or start the opening motion of the closing member when the pinching judging unit judges that the object is on the point of being pinched.

In operation of the above-constructed opening and closing motion control device, the linear electrostatic-capacity detecting unit embedded in the seal member always detects the electrostatic capacity in the circumference. Then, upon receipt of an output from the linear electrostatic-capacity detecting unit, the pinching judging unit judges whether or not the object is pinched by the closing motion of the closing member.

Regarding the principles of judgement in the pinching judging unit, when the object is pinched between the closing member and the ground potential member, then the object is firstly pressed on the seal member due to the closing motion of the closing member, so that the flexible seal member deforms its own profile corresponding to a pressure applied thereon. At this time, a distance between the liner electrostatic-capacity detecting unit and the ground potential member is shortened in comparison with that in the normal state where no pinching of the object is caused. As the result, the detection output of the electrostatic-capacity detecting unit changes from the detection output in the normal state. Upon detection of this sequential change in electrostatic capacity, the pinching judging unit judges that the object is pinched between the closing member and the ground potential member.

On the other hand, when the pinching of the object is judged by the pinching judging unit, the drive control unit makes the driving unit to either stop or open the closing member in order to prevent the object from being pinched.

Here, we compare the afore-mentioned prior art with the present invention.

Since it is judged by using the electrostatic-capacity proximity switch whether or not the object is approaching in the prior art, there is a possibility of regarding the approaching window glass as the object by mistake, which requires to provide the special limit switch in view of eliminating the erroneous detection. On the contrary, according to the invention, it is regarded as the pinching of the object when it is on the point of being pinched. Therefore, there is no need to provide the above limit switch, providing a simple and low-priced structure of the device.

Again in the prior art, when the dressed passenger's fingers or hand is pinched between the window frame and the window glass, there is a case that the pinching cannot be detected. On the contrary, according to the invention, it is regarded as the pinching of the object when it is on the point of being pinched. Thus, it is possible, to avoid the pinching of the object irrespective of its conditions, with high accuracy.

In summary, according to the above-mentioned opening and closing control device, it is possible to avoid the pinching of the object, which may be caused with the closing of the closing member, irrespective of the conditions, with high accuracy and also the simple and low-priced structure.

According to the second aspect of the invention, in the above-mentioned opening and closing motion control device, the electrostatic-capacity detecting unit is embedded in the seal member at a designated distance from the contact portion of the ground potential member, the contact portion being touched by the closing member when the closing member is closed up perfectly.

Then, with the arrangement of the electrostatic-capacity detecting unit, when it is promoted to mass-produce the opening and closing motion control devices, the distance between the liner electrostatic-capacity detecting unit and the ground potential member can be uniformly managed through respective production lots. Consequently, the preliminary work through the respective production lots, such as a gain adjustment, becomes useless, providing the opening and closing Motion control devices suitable for the mass-production.

According to the third aspect of the invention, in the above-mentioned opening and closing motion control device, the closing member is identical to a glass which is provided on an opening of a vehicle, while the seal member is identical to a weather strip which is provided along the contact portion of the ground potential member, the contact portion being touched by the closing member when the closing member is closed up perfectly.

With the adoption of the glass and the weather strip, it is possible to apply the present opening and closing motion control device to a power window driving device, a sun roof driving device and so on, properly.

According to the fourth aspect of the invention, the above-mentioned opening and closing motion control device further comprises an oscillating unit electrically connected to the electrostatic-capacity detecting unit, for oscillating a frequency signal corresponding to a detection output from the electrostatic-capacity detecting unit; a converting unit electrically connected to the oscillating unit, for converting the frequency signal outputted by the oscillating unit into an alternating voltage and also outputting an alternating voltage signal derived from the alternating voltage, and an amplification unit electrically connected to the converting unit, for amplifying the alternating voltage signal converted by the converting unit at a predetermined amplifying ratio. In this device, the pinching judging unit judges whether or not the object is pinched by the closing motion of the closing member, on the basis of the alternating voltage signal amplified by the amplification unit.

According to the fifth aspect of the invention, preferably, the opening and closing motion control device of the fourth aspect further comprises a detection unit electrically connected to the converting unit, for picking up a signal related to the sequential change in electrostatic-capacity from the alternating voltage signal and outputting the signal to the amplification unit.

Note, if merely converting the frequency signal outputted from the oscillating unit into a direct voltage and if there is produced an offset in detection output under the influence of disturbance, there would be a possibility of erroneous judgement where it is regarded as the pinching of the object although it is not pinched in reality. On the contrary, according to the fourth and fifth aspects of the invention, even if there is produced an offset in detection output under the influence of disturbance (e.g. adhering of dusts, rain, snow, etc.), it is possible to surely avoid the pinching of the object without being influenced by the disturbance since the present device is capable of detecting the change in electrostatic capacity standardizing the condition including the influence of disturbance, with ease.

According to the sixth aspect of the invention, preferably, the opening and closing motion control device of the fourth aspect further comprises an A/D (analog/digital) converting unit electrically connected to the amplification unit, for converting the alternating voltage signal amplified by the amplification unit to a digital signal, and a calculating unit electrically connected to the A/D converting unit, for calculating a voltage build-up rate by analyzing the digital signal converted by the A/D converting unit by time. In this device, the pinching judging unit judges whether or not the object is pinched by the closing motion of the closing member, on the basis of the voltage build-up rate calculated by the calculating unit.

Accordingly, even if it is hard to obtain a sufficient sequential change in electrostatic capacity due to the disturbance factor, such as contour of the contact portion of the ground potential member, it is possible to judge whether or not the object is pinched by the closing motion of the closing member with reference to the voltage build-up rate allowing even a tiny change in electrostatic capacity to be captured with ease, relatively. As the result, it is possible to avoid the pinching of the object irrespective of its conditions, with high accuracy.

According to the seventh aspect of the present invention, there is also provided an opening and closing motion control device which is constructed so as to perform an opening and closing motion of a closing member by using a driving unit for driving the closing member, the opening and closing motion control device comprising:

at least one plane seal member arranged along a contact portion of a non-conductive member, the contact portion being touched by the closing member when the closing member is closed up perfectly, the plane seal member having both flexibility and electrical insulation;

at least one plane electrostatic-capacity detecting unit laminated on the plane seal member, for always detecting an electrostatic capacity in the circumference of the electrostatic capacity detecting unit and also outputting the so-obtained electrostatic capacity;

a pinching judging unit electrically connected to the electrostatic-capacity detecting unit, for judging whether dr not an object is pinched by the closing motion of the closing member, on the basis of the detection of pinching by the plural electrostatic-capacity detecting unit; and a drive control unit electrically connected to the pinching judging unit, allowing the driving unit to either stop the closing member or start the opening motion of the closing member when the pinching judging unit judges that the object is on the point of beings pinched.

In addition to the operation of the former opening and closing motion control device, since the electrostatic-capacity detecting unit and the seal member is laminated on each other, even if the member to be touched by the closing member in case of closing it perfectly is non-conductive, it is possible to obtain the opening and closing motion control device which is superior in terms of the effect of increasing the change in electrostatic-capacity and the effect of avoiding the influence of disturbance.

According to the eighth aspect of the invention, in the device of the seventh aspect, the plural plane seal members and the plural plane electrostatic-capacity detecting units are laminated by turns.

In this case, since the electrostatic-capacity detecting units (layers) and the seal members (electrical insulation layers) are arranged in a multi-layer structure, even if the ground potential material is non-conductive, it is possible to obtain the opening and closing motion control device which is more superior in terms of the effect of increasing the change in electrostatic-capacity and the effect of avoiding the influence of disturbance, in comparison with the device of the seventh aspect.

These and other objects and features of the present invention will become more fully apparent from the following description and appended claims taken in conjunction with the accompany drawing.

DESCRIPTION OF THE PREFERRED EMBODIMENT

An opening and closing motion control device in accordance with embodiments of the present invention will be described with reference to drawings, taking example by a power window device where the opening and closing motion of a door window against a window frame of a vehicle is performed by using a driving unit, such as a motor for driving the door window.

Figure 1:
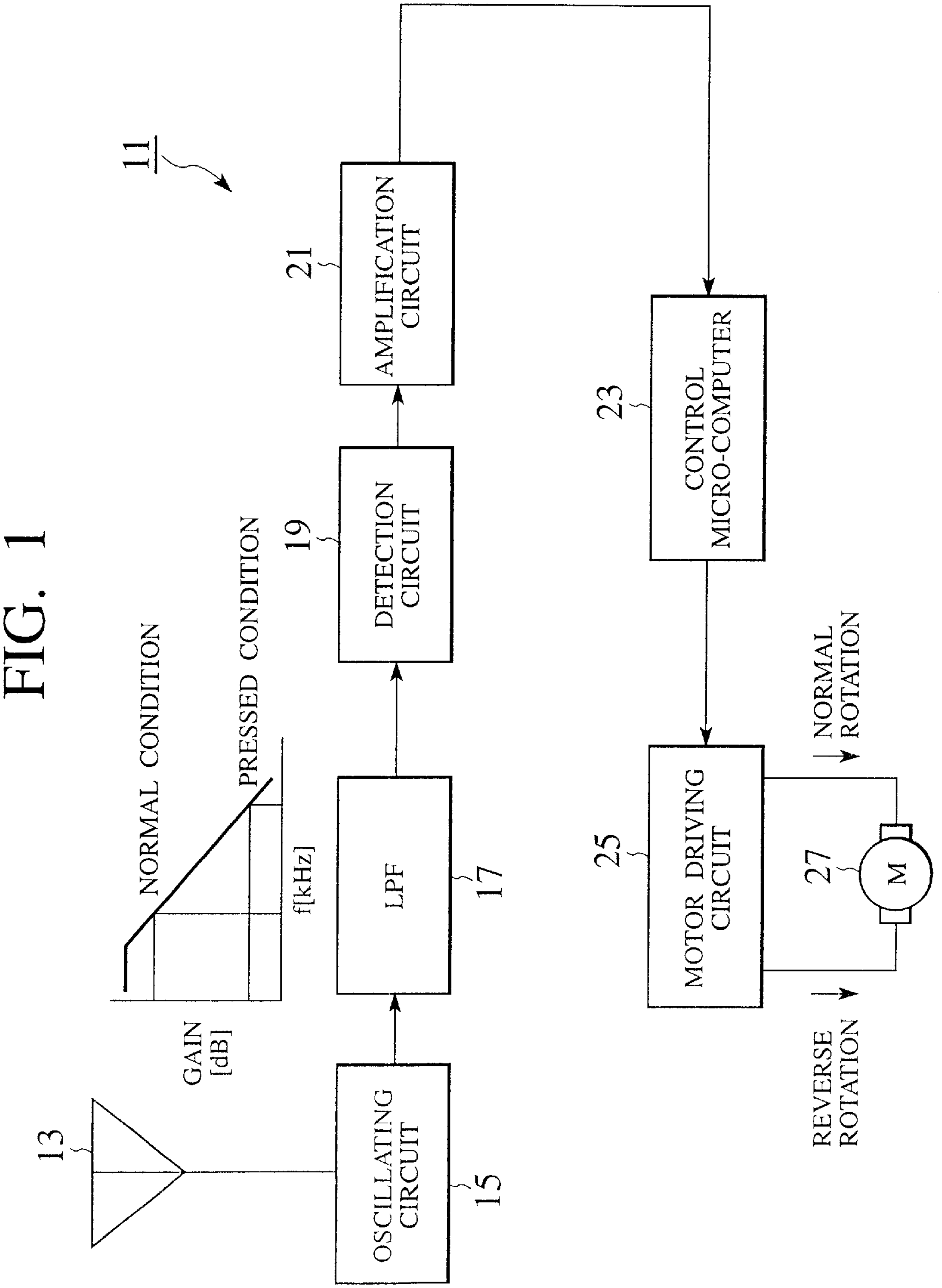
FIG. 1 is a functional block diagram of ant opening and closing motion control device in accordance with an embodiment of the present invention.
Figure 2:
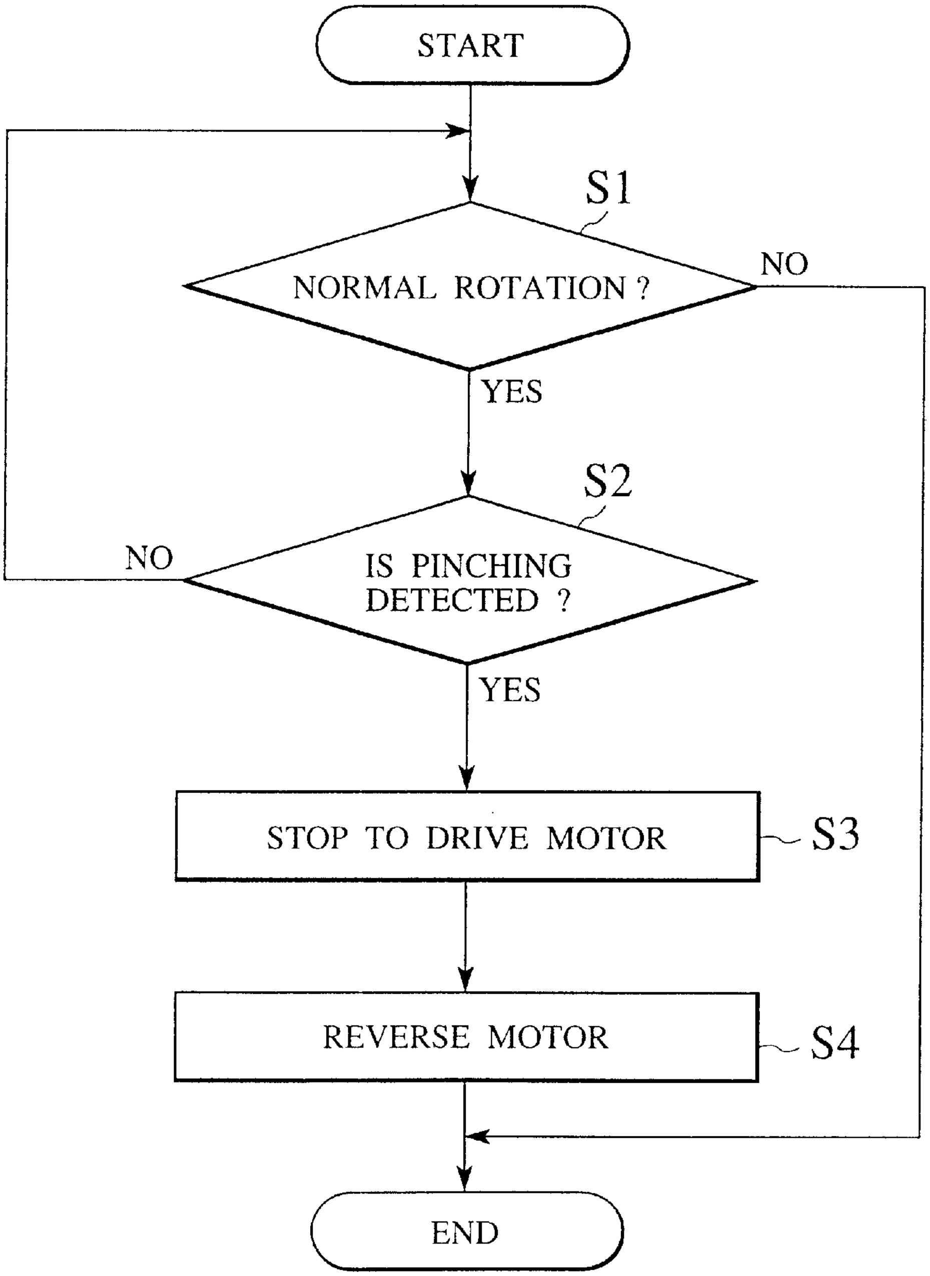
FIG. 2 is a flow chart for explanation of the operation of an essential part of the opening and closing motion control device of the embodiment.
Figure 3:
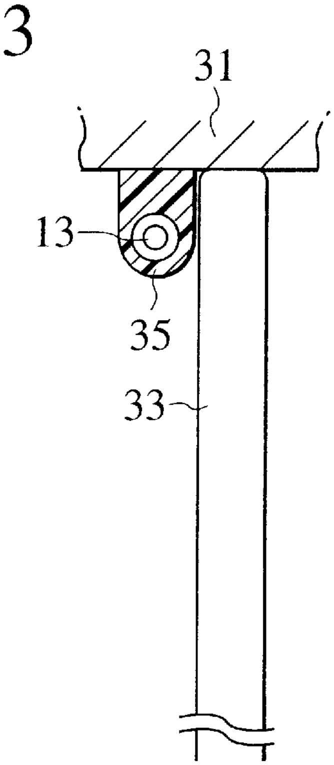
FIG. 3 is a view showing a positional relationship among a window frame, a weather strip having an electrostatic-capacity sensor included therein and a door window of the device.
Figure 4:
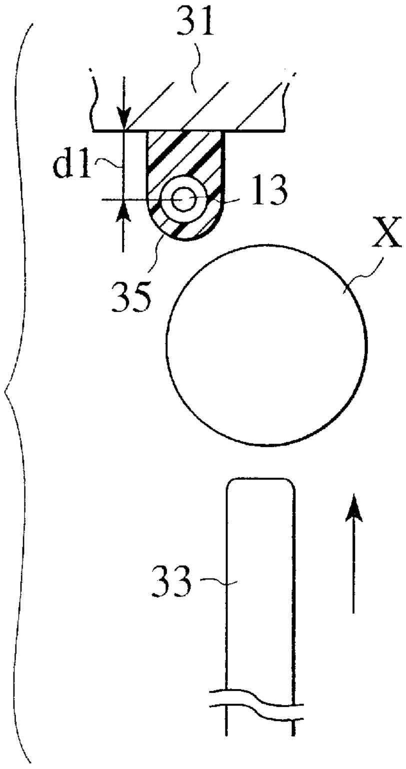
FIG. 4 is a view showing the positional relationship among the windrow frame, the weather strip having the electrostatic-capacity sensor included therein and the door window of the device.
Figure 5:
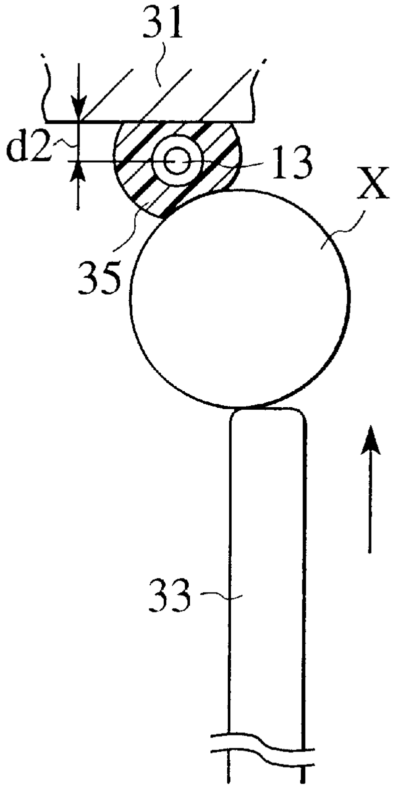
FIG. 5 is a view showing the positional relationship among the windrow frame, the weather strip having the electrostatic-capacity sensor included therein and the door window of the device.
Figure 6:
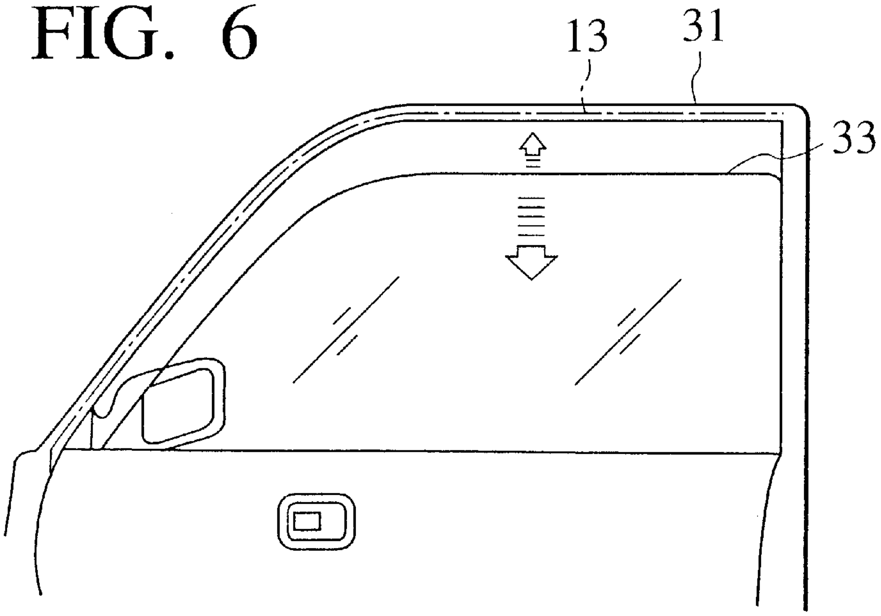
FIG. 6 is a view provided for explanation of the position of the electrostatic-capacity sensor with respect to the window frame.
Figure 7:
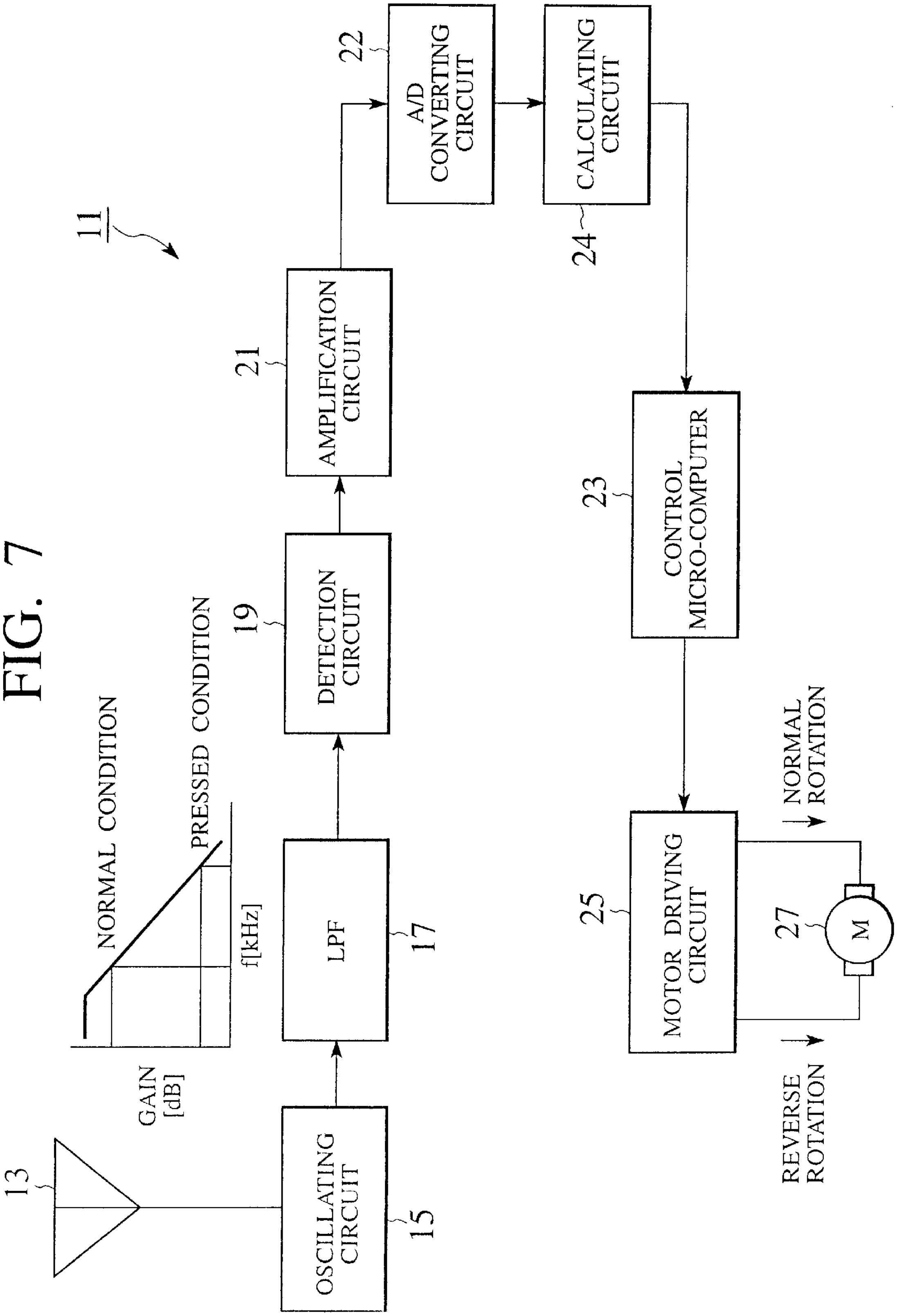
FIG. 7 is a functional block diagram of the opening and closing motion control device in accordance with another embodiment of the present invention.
Figure 8:
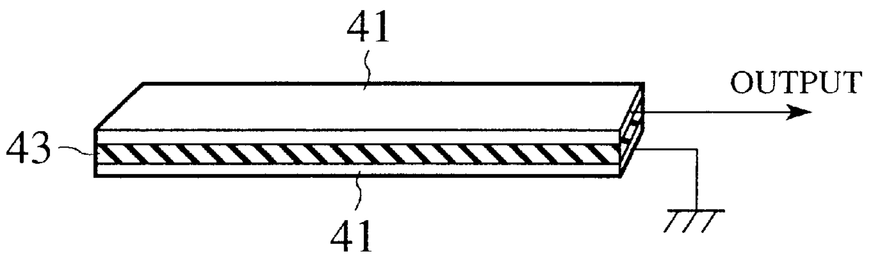
FIG. 8 is a perspective view of the electrostatic-capacity sensor in the modification.
Figure 9:
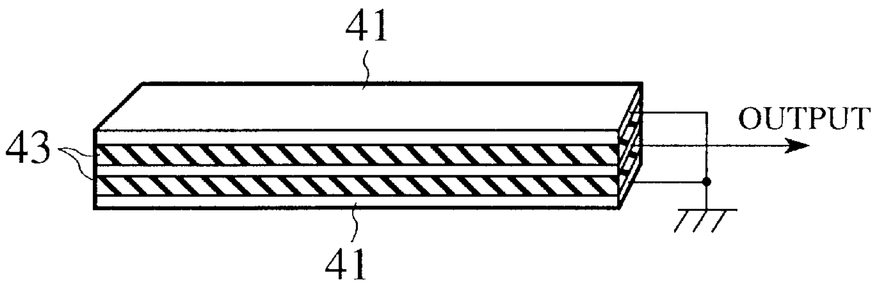
FIG. 9 is a perspective view of the electrostatic-capacity sensor in the other modification.
Figure 10:
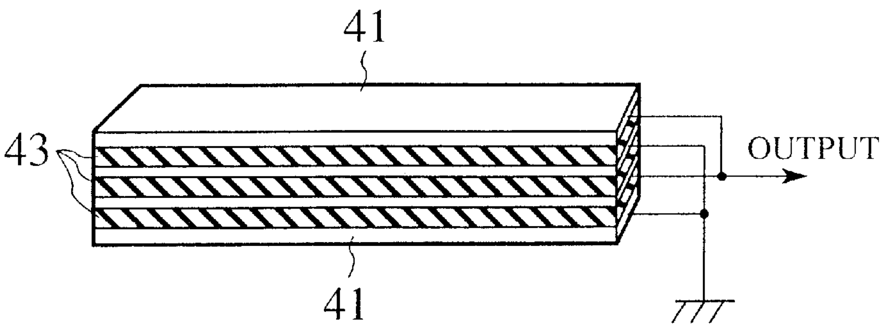
FIG. 10 is a perspective view of the electrostatic-capacity sensor in the further modification.

In the figures, FIG. 1 is a functional block diagram of the opening and closing motion control device, FIG. 2 is a flow chart for explanation of the operation of an essential part of the device, FIGS. 3 to 5 are sequent views showing the positional relationships among the window frame, a weather strip having an electrostatic-capacity sensor included therein and the door window of the device, FIG. 6 is a view provided for explanation of the position of the electrostatic-capacity sensor with respect to the window frame, FIG. 7 is a functional block diagram of the opening and closing motion control device in the modification, and FIGS. 8 to 10 show the other modifications of the electrostatic-capacity sensor.

As shown in FIG. 1, the opening and closing motion control device 11 of the invention comprises a linear-type of electrostatic-capacity sensor 13 operating as an electrostatic-capacity detecting unit of the invention, an oscillating circuit 15 operating as an oscillating unit, a low-pass filter 17 (referred to "LPF" hereinafter) as a converting unit, a detection circuit 19, an amplification circuit 21 as an amplification unit, a control micro-computer 22 operating as a pinching detecting unit and a motor driving circuit 25 operating as a driving control unit executing the drive control of a motor 27.

The linear-type electrostatic-capacity sensor 13 has a function to usually detect an electrostatic-capacity in the circumference and is arranged on the vehicle's interior side of a window frame 31 with which a door window (or window glass) 33 comes in contact in case of closing the window glass 33 and also arranged along the periphery of the window frame 31 except the lower end, as shown in FIGS. 3 and 6. In detail, the linear-type electrostatic-capacity sensor 13 is embedded in a weather strip 35 arranged along the window frame 31, for maintaining a passenger's room in both watertight and airtight manner. Note, a sequential change (as time passes) in electrostatic capacity detected by the sensor 13 is produced by its relative movement in an intense electric field. Taking example by a conductive human body as the object X, it is found on the inventor's test that the direct exposing of the naked human body on the sensor 13 allows the detected electrostatic capacity to be varied more remarkably.

The oscillating circuit 15 having the electrostatic-capacity sensor 13 connected thereto has a function to oscillate a signal having a frequency corresponding to an oscillating output related to the sequential change in electrostatic-capacity of the sensor 13.

The LPF 17 having the oscillating circuit 15 connected thereto has a function to convert a signal of an alternating voltage presenting a change of crest value corresponding to the oscillating frequency.

The detection circuit 19 having the LPF 17 connected thereto has a function to detect a signal related to the sequential change in electrostatic capacity by the above "alternating voltage" signal outputted from the LPF 17.

The amplification circuit 21 having the detection circuit 19 connected thereto has a function to amplify the alternating voltage signal outputted from the detection circuit 19 at a designated amplification rate LPF 1. Note, a center value of the alternating voltage signal amplified by the amplification circuit 21 is shifted to a positive (+) side in case of the electrostatic-capacity sensor's approaching to the window frame 31 due to the pinching of the object X, while the center value is shifted to a negative (–) side in case of the electrostatic-capacity sensor's separating from the window frame 31. However, such a shift of the center value converges on a ground potential under a preset "time constant". Therefore, even if the electrostatic-capacity sensor 13 has an alien substance (e.g. dust, rain, snow, etc.) adhered thereto, there is produced, a sequential change in electrostatic capacity whenever the object X is pinched. Further, the amplification circuit 21 is constructed so as to input the above value into a not-shown comparator for comparing it with a threshold value as a reference and sequentially output the resultant comparison result to the control micro-computer 23. Upon receipt of the comparison result, when the comparison result at the comparator does change as time passes together with the closing motion of the window glass 33, then the control micro-computer 23 judges 35 that the pinching of the object X is caused.

With reference to FIGS. 4 and 5, we now describe the principles of judgement whether the object X is being pinched or not, which is carried out by the control micro-computer 23.

First of all, when the object X is pinched between the window glass 33 and the window frame 31, then the object X is firstly pressed on the weather strip 35 due to the closing motion of the window glass 33, so that the flexible weather strip 35 deforms its own profile corresponding to a pressure applied thereon. At this time, a distance d2 between the sensor 13 and the window frame 31 at the depression is short in comparison with that in the normal state where no pinching of the object X is caused. As the result, the detection output of the electrostatic-capacity sensor 13 changes larger than that in the normal state. In supplement, since the window frame 31 constitutes a part of vehicle body using metallic materials while the vehicle body is always maintained to the ground potential, the approaching of the sensor 13 toward the window frame 31 causes a large sequential change in electrostatic capacity to be produced and sequentially oscillated for output in the form of a large frequency through the oscillating circuit 15. Upon detection of the sequential change in electrostatic capacity, the control micro-computer 23 judges that the object X is pinched between the window glass 33 and the window frame 31.

It is noted again that the control micro-computer 23 is adapted so as to judge whether or not the object X is pinched with the closing motion of the window glass 33 on the ground of the alternating voltage signal amplified by the amplification circuit 21. Therefore, even if there is produced an offset in detection output under the influence, of disturbance (e.g. adhering of dusts, rain, snow, etc.), it is possible to surely avoid the pinching of the object X without being influenced by the disturbance since the present device is capable of detecting the change in electrostatic capacity standardizing the condition including the influence of disturbance, with ease. On the contrary, if merely converting the frequency signal outputted from the oscillating circuit 15 into a direct voltage and if there is produced an offset in detection output under the influence of disturbance, there would be a possibility of erroneous judgement where it is regarded as the pinching of the object although it is not pinched in reality.

The motor driving circuit 25 carries out the control to either stop or drive a powered window drive motor 27 so as to lower the window glass 33.

Next, we describe the schematic operation of the control micro-computer 23 as an essential constituent of the present device 11.

At step S1, the control micro-computer 23 judges whether or not the motor 27 is driven in its formal rotating direction for closing the window glass 33. At this step S1, if it is judged that the motor 27 is driven in the reversing direction or the motor 27 is maintained in its stopped condition (No), then one cycle of routine is ended. While, when the judgement at step S12 is Yes, the routine goes to step S2.

At step S3, the control micro-computer 23 further judges whether or not the object X is being pinched, on the basis of the detection output from the electrostatic-capacity sensor 13.

If the judgement at step S2 is No, that is, in case of no pinching the object X, then the routine returns to step Si to repeat the above-mentioned processes. Conversely, if the judgement at step S2 is Yes, the routine goes to step S3.

At step S3, it is executed to command the motor driving circuit 25 to stop the motor 27, by the control micro-computer 23. Consequently, the motor 27 does cease driving by the control micro-computer 23.

At sequent step S4, by the control micro-computer 23, it is executed to command the motor driving circuit 25 to rotate in the reverse direction. Thus, the motor 27 is reversed, whereby it is possible to avoid restricting the object X between the window glass 33 and the window frame 31.

Here, we compare the afore-mentioned prior art with the present invention.

Since it is judged by using the electrostatic-capacity proximity switch whether or not the object is approaching in the prior art, there is a possibility of regarding the approaching window glass 33 as the object by mistake, which requires to provide the special limit switch in view of eliminating the erroneous detection. On the contrary, according to the invention, as it is regarded as the pinching of the object when it is on the point of being pinched, there is no need to provide the above limit switch, providing a simple and low-priced structure of the device.

Again in the prior art, when the dressed passenger's fingers or hand is pinched between the window frame and the window glass, there is a case that the pinching cannot be detected. On the contrary, according to the invention, as it is regarded as the pinching of the object when it is on the point of being pinched, it is possible to avoid the pinching of the object irrespective of its conditions, with high accuracy.

In summary, according to the opening and closing control device 11 of the invention, it is possible to avoid the pinching of the object X, which may be caused with the closing of the window glass 33, irrespective of the conditions, with high accuracy and also the simple and low-priced structure.

Although the invention has been described above by reference to an embodiment of the invention, the invention is not limited to the embodiment described above. Modifications and variations of the embodiment described above will occur to those skilled in the art, in the scope of claims.

For example, the opening and closing motion control device of the invention is applicable to an opening roof (sun roof) driving device for a vehicle. Additionally, besides automotive devices, the present invention is applicable to all sorts of opening and closing motion control devices each of which is constructed so as to perform the opening and closing motion of a closing member by using a driving unit for driving the closing member.

In connection, although the window glass is opened and closed with respect to the window frame of the vehicle in the embodiment, it may be applied to a hardtop type of vehicle where the window glass is driven to a vehicle body.

In the modification, the linear electrostatic-capacity detecting unit (e.g., the electrostatic-capacity sensor 13) may be embedded in the sealing member (e.g., the weather strip 35) at a designated distance from a contact portion of the ground potential member (e.g., the window frame 31), the contact portion being touched by the closing member (e.g., the window glass 33) when the closing member is closed up perfectly.

With the above arrangement, when it is promoted to mass-produce the opening and closing motion control devices, the distance between the linear electrostatic-capacity detecting unit and the ground potential member can be uniformly managed through respective production lots. Consequently, the preliminary work through the respective production lots, such as a gain adjustment, becomes useless, providing the opening and closing motion control devices suitable for the mass-production.

In the modification, as shown in FIG. 7, the opening and closing motion control device 11 further includes an A/D (analog/digital) converting unit 22 electrically connected to the amplification unit 21, for converting the alternating voltage signal amplified by the amplification unit 21 to a digital signal and a calculating unit 24 electrically connected to the A/D converting unit 22, for calculating a voltage build-up rate by analyzing the digital signal converted by the A/D converting unit 22 by time, furthermore. In this case, the control micro computer 23 as the pinching judging unit judges whether or not the object, X (FIG. 4) is pinched by the closing motion of the window glass 33, on the basis of the voltage build-up rate calculated by the calculating unit 24.

With the above-mentioned operation of the pinching judging unit, even if it is hard to obtain a sufficient sequential change in electrostatic capacity due to the disturbance factor, such as contour of the contact portion of the ground potential member, it is possible to judge whether or not the object is pinched by the closing motion of the closing member with reference to the voltage build-up rate allowing even a tiny change in electrostatic capacity to be captured with ease, relatively. As the result, it is possible to avoid the pinching of the object irrespective of its conditions, with high accuracy.

As to the electrostatic-capacity detecting unit of the invention, as shown in FIGS. 8 to 10, it may be constituted by a laminating structure where electrostatic-capacity detecting layers 41 and electrical insulation layers 43 are overlaid on each other.

Then, even if the ground potential material to be touched by the closing member in case of closing it perfectly is non-conductive, it is possible to obtain the opening and closing motion control device which is superior in terms of the effect of increasing the change in electrostatic-capacity and the effect of avoiding the influence of disturbance.

Preferably, as shown in FIGS. 9 and 10, each electrostatic-capacity detecting layer 41 and each electrical insulation layer 43 are formed so as not to prevent the plural layers 41, 43 from being laminated on each other.

Also in this case, since the electrostatic-capacity detecting layers 41 and the electrical insulation layers 43 are arranged in a multi-layer structure, even if the ground potential material is non-conductive, it is possible to obtain the opening and closing motion control device which is more superior in terms of the effect of increasing the change in electrostatic-capacity and the effect of avoiding the influence of disturbance, in comparison with the above modification of FIG. 8.

The scope of the invention is defined with reference to the following claims.

What is claimed is:

1. An opening and closing motion control device, which is constructed so as to perform an opening and closing motion of a closing member by using a driving unit for driving the closing member, the opening and closing motion control device comprising:

a flexible seal member arranged along a contact portion of a ground potential member, the contact portion being touched by the closing member when the closing member is closed;

a linear electrostatic-capacity detecting unit embedded in the seal member at a predetermined distance from the contact portion of the ground potential member, for detecting an electrostatic capacity in the circumference of the electrostatic-capacity detecting unit and also outputting the so-obtained electrostatic capacity;

a pinching judging unit electrically connected to the electrostatic-capacity detecting unit, for judging whether or not an object has been pinched by the closing motion of the closing member, on the basis of a variation in the electrostatic capacity corresponding to a difference between the predetermined distance and an actual distance of the linear electrostatic-capacity detection unit from the contact portion of the ground potential member; and a drive control unit electrically connected to the pinching judging unit, allowing the driving unit to either stop the closing member or start the opening motion of the closing member when the pinching judging unit judges that the object is on the point of being pinched.

2. The opening and closing motion control device as claimed in claim 1 wherein:

the closing member is identical to a glass which is provided on an opening of a vehicle; and the seal member is identical to a weather strip which is provided along the contact portion of the ground potential member, the contact portion being touched by the closing member when the closing member is closed up perfectly.

3. An opening and closing motion control device, which is constructed so as to perform an opening and closing motion of a closing member by using a driving unit for driving the closing member, the opening and closing motion control device comprising:

a flexible seal member arranged along a contact portion of a ground potential member, the contact portion being touched by the closing member when the closing member is closed;

a linear electrostatic-capacity detecting unit embedded in the seal member, for detecting an electrostatic capacity in the circumference of the electrostatic-capacity detecting unit and also outputting the so-obtained electrostatic capacity;

a pinching judging unit electrically connected to the electrostatic-capacity detecting unit, for judging whether or not an object is pinched by the closing motion of the closing member, on the basis of the detection of pinching by the electrostatic-capacity detecting unit;

a drive control unit electrically connected to the pinching judging unit, allowing the driving unit to either stop the closing member or start the opening motion of the closing member when the pinching judging unit judges that the object is on the point of being pinched;

an oscillating unit electrically connected to the electrostatic-capacity detecting unit, for oscillating a frequency signal corresponding to a detection output from the electrostatic-capacity detecting unit;

a converting unit electrically connected to the oscillating unit, for converting the frequency signal outputted by the oscillating unit into an alternating voltage and also outputting an alternating voltage signal derived from the alternating voltage; and an amplification unit electrically connected to the converting unit, for amplifying the alternating voltage signal converted by the converting unit at a predetermined amplifying ratio;

wherein the pinching judging unit judges whether or not the object is pinched by the closing motion of the closing member, on the basis of the alternating voltage signal amplified by the amplification unit.

4. The opening and closing motion control device as claimed in claim 3, further comprising:

a detection unit electrically connected to the converting unit, for picking up a signal related to the sequential change in electrostatic-capacity from the alternating voltage signal and outputting the signal to the amplification unit.

5. The opening and closing motion control device as claimed in claim 3, further comprising:

an A/D (analog/digital) converting unit electrically connected to the amplification unit, for converting the alternating voltage signal amplified by the amplification unit to a digital signal; and a calculating unit electrically connected to the A/D converting unit, for calculating a voltage build-up rate by analyzing the digital signal converted by the A/D converting unit by time;

wherein the pinching judging unit judges whether or not the object is pinched by the closing motion of the closing member, on the basis of the voltage build-up rate calculated by the calculating unit.

6. An opening and closing motion control device, which is constructed so as to perform an opening and closing motion of a closing member by using a driving unit for driving the closing member, the opening and closing motion control device comprising:

at least one plane seal member arranged along a contact portion of a non-conductive ground potential member, the contact portion being touched by the closing member when the closing member is closed, the plane seal member having both flexibility and electrical insulation;

at least two plane electrostatic-capacity detecting units laminated on the plane seal member, for detecting an electrostatic capacity in the circumference of the electrostatic-capacity detecting units and also outputting the so-obtained electrostatic capacity;

a pinching judging unit electrically connected to the electrostatic-capacity detecting units, for judging whether or not an object has been pinched by the closing motion of the closing member, on the basis of the detection of pinching by the electrostatic-capacity detecting units; and a drive control unit electrically connected to the pinching judging unit, allowing the driving unit to either stop the closing member or start the opening motion of the closing member when the pinching judging unit judges that the object is on the point of being pinched.

7. The opening and closing motion control device as claimed in claim 6 wherein:

the plural plane seal members and the plural plane electrostatic-capacity detecting units are laminated by turns.

* * * * *